United States Patent
Boudreaux (10) Patent No.: US 7,028,754 B2
(45) Date of Patent: Apr. 18, 2006

(54) HIGH SURFACE AREA HEAT SINK

(75) Inventor: Brent A. Boudreaux, Highland Village, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/832,963

(22) Filed: Apr. 26, 2004

(65) Prior Publication Data

US 2005/0236142 A1 Oct. 27, 2005

(51) Int. Cl.
*F28F 7/02* (2006.01)

(52) U.S. Cl. ..................... 165/80.3; 165/185

(58) Field of Classification Search ........... 165/80.2, 165/80.3, 185

See application file for complete search history.

(56) References Cited

U.S. PATENT DOCUMENTS

| 5,258,887 | A | * | 11/1993 | Fortune | 361/720 |
| 5,285,350 | A | * | 2/1994 | Villaume | 165/80.3 |
| 5,535,816 | A | * | 7/1996 | Ishida | 165/80.3 |
| 5,781,411 | A | * | 7/1998 | Feenstra | 165/80.3 |
| 6,043,986 | A | * | 3/2000 | Kondo et al. | 361/720 |
| 6,478,082 | B1 | * | 11/2002 | Li | 165/185 |
| 6,543,521 | B1 | * | 4/2003 | Sato et al. | 165/80.3 |
| 6,841,250 | B1 | * | 1/2005 | Tzeng | 165/905 |
| 2003/0205369 | A1 | * | 11/2003 | Liu et al. | 165/185 |

* cited by examiner

*Primary Examiner*—Teresa J. Walberg
(74) *Attorney, Agent, or Firm*—Leslie P. Gehman (57) ABSTRACT

A heat sink is built including a three dimensional array of cylindrical openings for air to flow through instead of fins. By having a larger surface area than heat sinks with fins, this high surface area heat sink results in increased heat transfer to the surrounding air than a similarly sized heat sink with fins. Heat sinks including an array of cylindrical openings may be manufactured through extrusion, stamping, and other common techniques.

18 Claims, 8 Drawing Sheets

HIGH SURFACE AREA HEAT SINK

FIELD OF THE INVENTION

The present invention relates generally to the field of heat sinks, and more particularly to the field of high efficiency heat sinks.

BACKGROUND OF THE INVENTION

As modern electronics evolve, they continue to shrink in size, yet increase in power density, and in the amount of heat they generate during operation. In order for these electronic devices to perform properly, their temperature must be strictly controlled within a given temperature range. Often, designers will attach heat sinks to the electronic devices to dissipate this excess heat. Typically heat sinks include fins or pins to increase the surface area of the heat sink within a constrained space and thus correspondingly increase the heat transfer capacity of the heat sink.

SUMMARY OF THE INVENTION

A heat sink is built including a three dimensional array of cylindrical openings for air to flow through instead of fins. By having a larger surface area than heat sinks with fins, this high surface area heat sink results in increased heat transfer to the surrounding air than a similarly sized heat sink with fins. Heat sinks including an array of cylindrical openings may be manufactured through extrusion, stamping, and other common techniques.

Other aspects and advantages of the present invention will become apparent from the following detailed description, taken in conjunction with the accompanying drawings, illustrating by way of example the principles of the invention.

DETAILED DESCRIPTION

Figure 1:
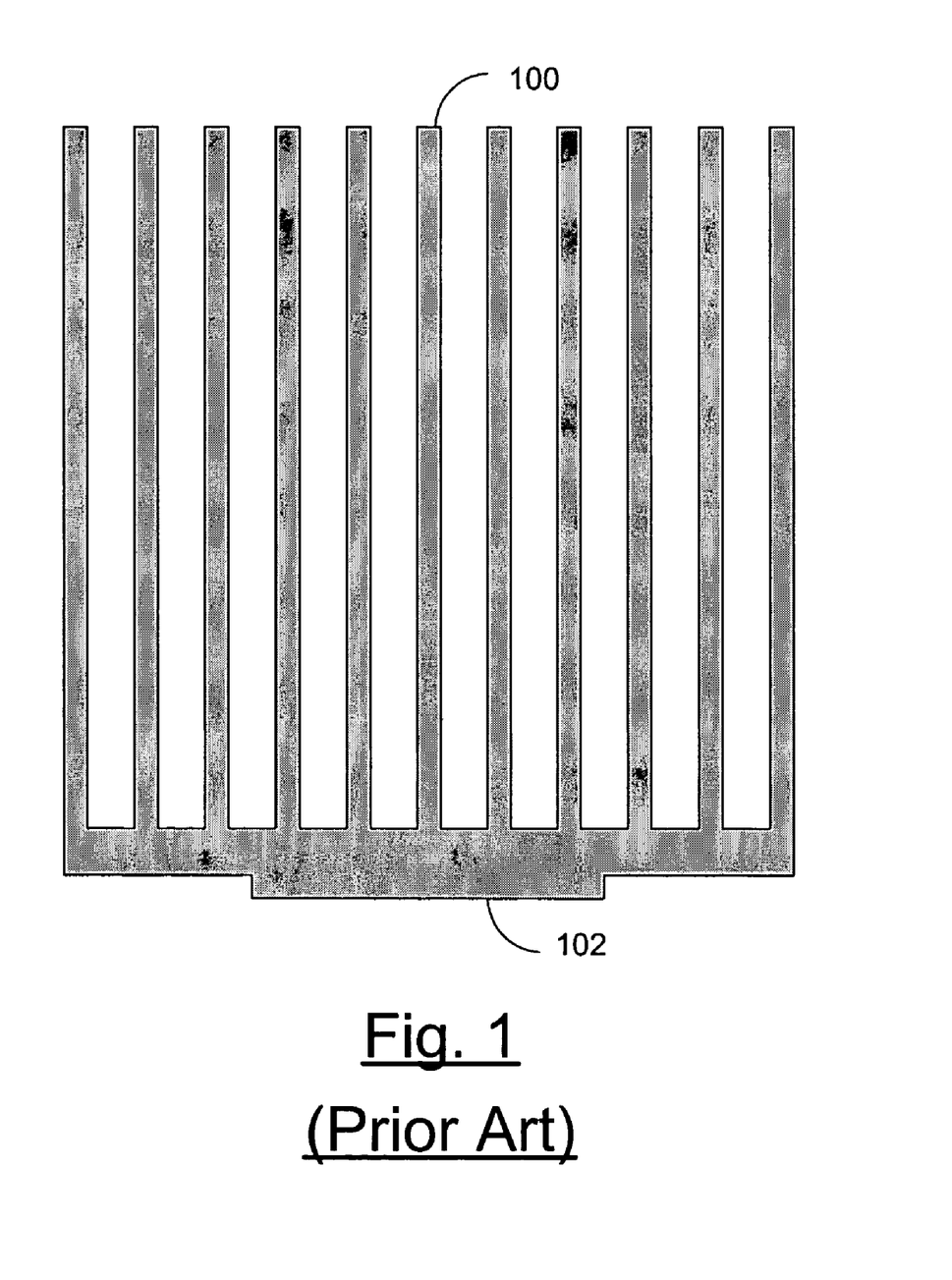
FIG. 1 is a side view of a typical prior art heat sink.

FIG. 1 is a side view of a typical prior art heat sink. In this example of a prior art heat sink, the heat sink includes a heat sink body 100, a heat sink base 102 that is configured to thermally couple with a heat generating electronic device, along with a plurality of heat sink fins 104. These fins 104 are used to increase the surface area of the heat sink since the heat transfer capability of the heat sink is proportional to surface area. Often fans are used to flow air through the fins 104, also increasing heat transfer. When fans are used, the heat sink must be aligned with the flow of air, to allow the air to flow between the fins 104 instead of being blocked by the outer fins 104.

Figure 2:
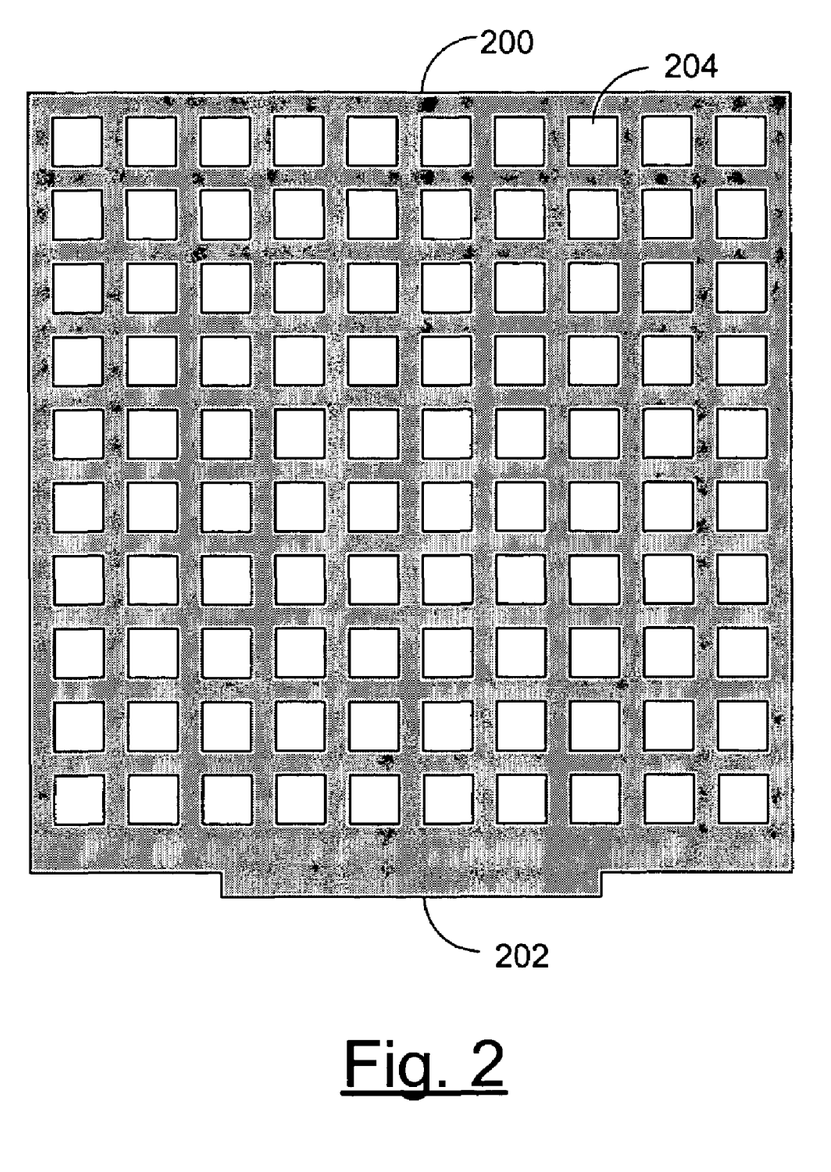
FIG. 2 is a side view of a high surface area heat sink according to the present invention.

FIG. 2 is a side view of a high surface area heat sink according to the present invention. In this example embodiment of the present invention, a heat sink is constructed including a heat sink body 200 a heat sink base 202 and an array of cylindrical openings 204 within the heat sink body 200. Note, that not all cylinders have circular cross-sections, and that those shown in this example embodiment of the present invention have square cross-sections. Other embodiments of the present invention may use cylindrical openings 204 with other shapes of cross-sections, all within the scope of the present invention. By eliminating heat sink fins and instead constructing a heat sink including an array of cylindrical openings 204, the surface area of the heat sink is increased, resulting in improved heat transfer from the heat sink to the atmosphere. Those of skill in the art will recognize that these heat sinks may be manufactured in a wide variety of methods such as extrusion, milling, or other fabrication techniques within the scope of the present invention. While this example embodiment of the present invention includes an array of cylindrical openings 204, those of skill in the art will recognize that there is no need for these openings to form an array. In fact, any plurality of openings in any configuration may suffice to increase the surface area of the heat sink.

Figure 3:
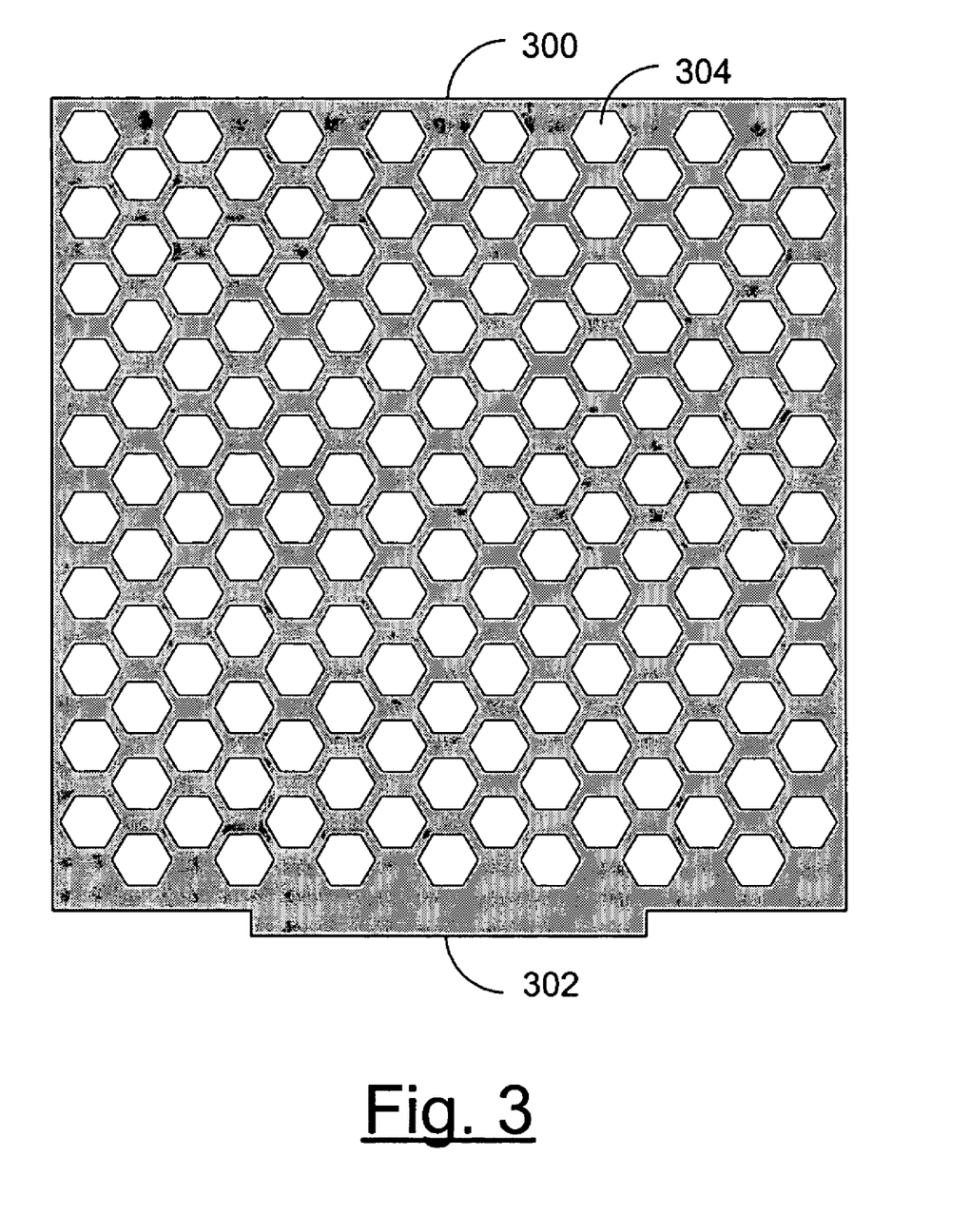
FIG. 3 is a side view of a high surface area heat sink according to the present invention.

FIG. 3 is a side view of a high surface area heat sink according to the present invention. The example embodiment shown in FIG. 3 is similar to that of FIG. 2 with the exception that the cross-section of the cylindrical columns 304 within the heat sink body 300 is now hexagonal instead of square. This example embodiment of the present invention is a heat sink including a heat sink body 300, a heat sink base 302 configured to thermally couple to a heat generating electronic device, along with an array of cylindrical openings 304 within the heat sink body 300. Once again these cylindrical openings 304 act to increase the surface area of the heat sink and thus increase its heat transfer capacity.

Figure 4:
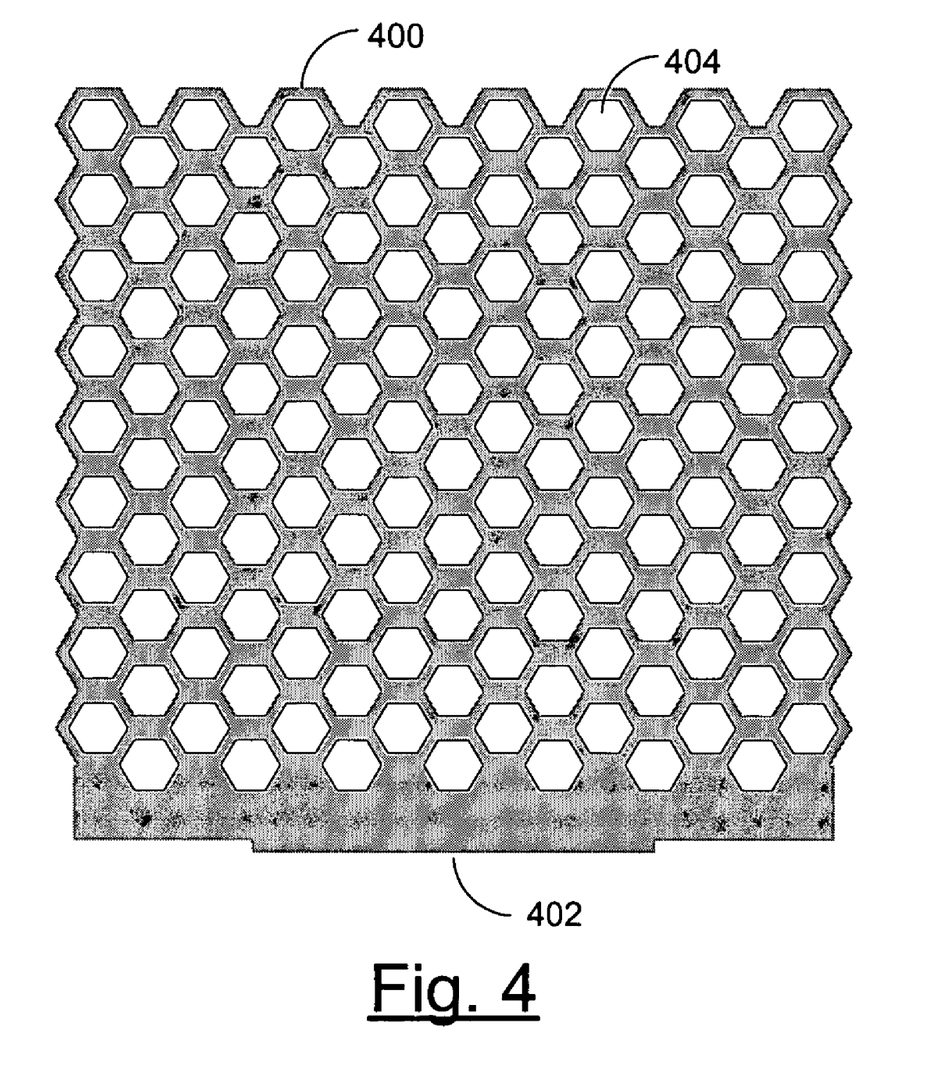
FIG. 4 is a side view of a high surface area heat sink according to the present invention.

FIG. 4 is a side view of a high surface area heat sink according to the present invention. This example embodiment of the present invention is similar to that of FIG. 4 with the exception, that some of the heat sink material on the top and sides of the heat sink body 400 have been removed to reduce weight and slightly increase surface area of the heat sink. This example embodiment of the present invention may be more easily manufactured by extrusion than the example shown in FIG. 3. This example embodiment of the present invention is a heat sink including a heat sink body 400, a heat sink base 402 configured to thermally couple to a heat generating electronic device, along with an array of cylindrical openings 404. Similar honeycomb material suitable for use as a heat sink body 400 may be found in material used in electromagnetic interference (EMI) applications.

This material may then be mechanically and thermally coupled to a heat sink base 402 to create a high surface area heat sink.

Figure 5A:
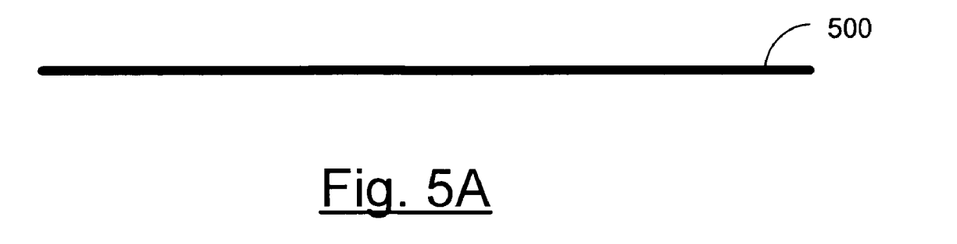
FIG. 5A is a side view of a sheet of thermally conductive material for use in manufacturing a high surface area heat sink according to the present invention.
Figure 5B:
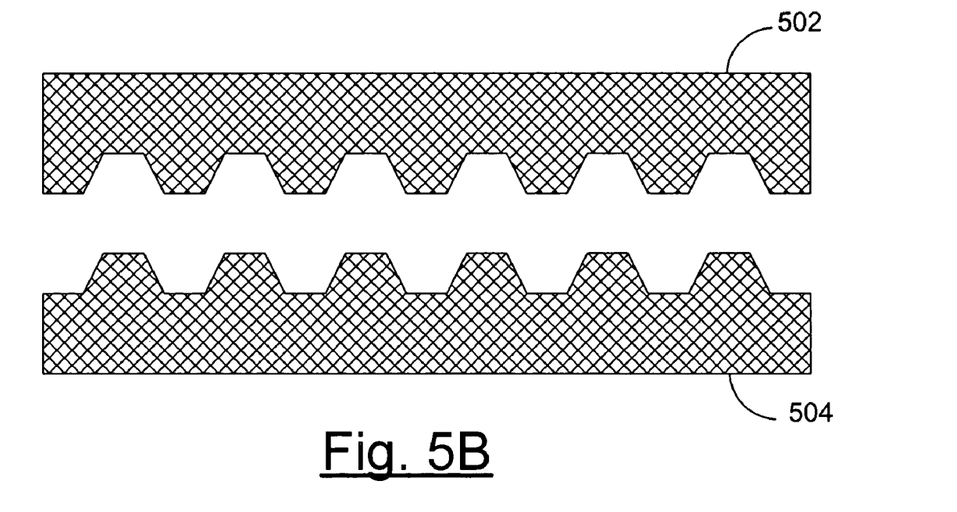
FIG. 5B is a side view of a pair of molds for use in manufacturing a high surface area heat sink according to the present invention.
Figure 5C:
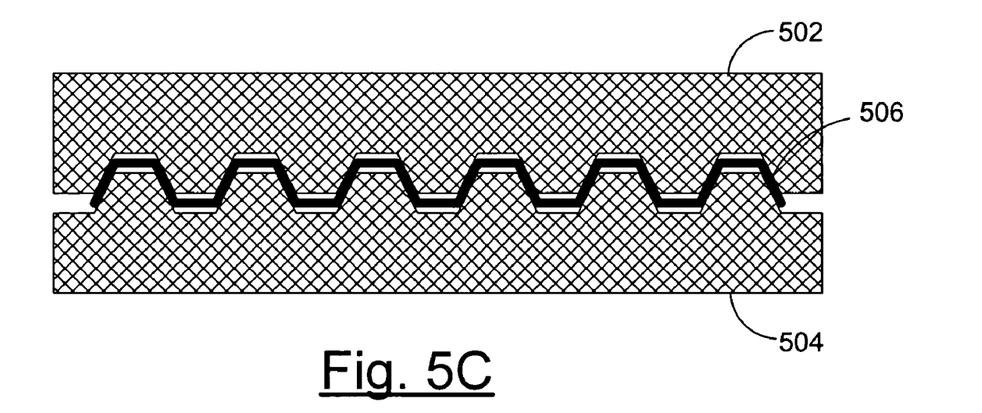
FIG. 5C is a side view of the pair of molds from FIG. 5B and the thermally conductive material from FIG. 5A, during manufacturing of a high surface area heat sink according to the present invention.

FIG. 5A is a side view of a sheet of thermally conductive material for use in manufacturing a high surface area heat sink according to the present invention. FIGS. 5A through 5C demonstrate one possible method of manufacturing a high surface area heat sink according to the present invention. FIG. 5A shows a side view of a sheet of thermally conductive material 500 for use in manufacturing a high surface area heat sink. This thermally conductive material 500 may be any of a variety of materials such as aluminum or copper within the scope of the present invention.

FIG. 5B is a side view of a pair of molds for use in manufacturing a high surface area heat sink according to the present invention. A top mold 502 and a bottom mold 504 are configured to stamp material into a shape configured to create cylindrical openings when sheets of stamped material are mechanically and thermally coupled together to form a heat sink body.

FIG. 5C is a side view of the pair of molds from FIG. 5B and the thermally conductive material from FIG. 5A, during manufacturing of a high surface area heat sink according to the present invention. In this example embodiment of the present invention the top mold 502 and the bottom mold 504 have been brought together to stamp the thermally conductive material 500 into a sheet of stamped material 506. This stamped material 506 may then be assembled with other sheets of stamped material 506 to form a high surface area heat sink similar to that of FIG. 6.

Figure 6:
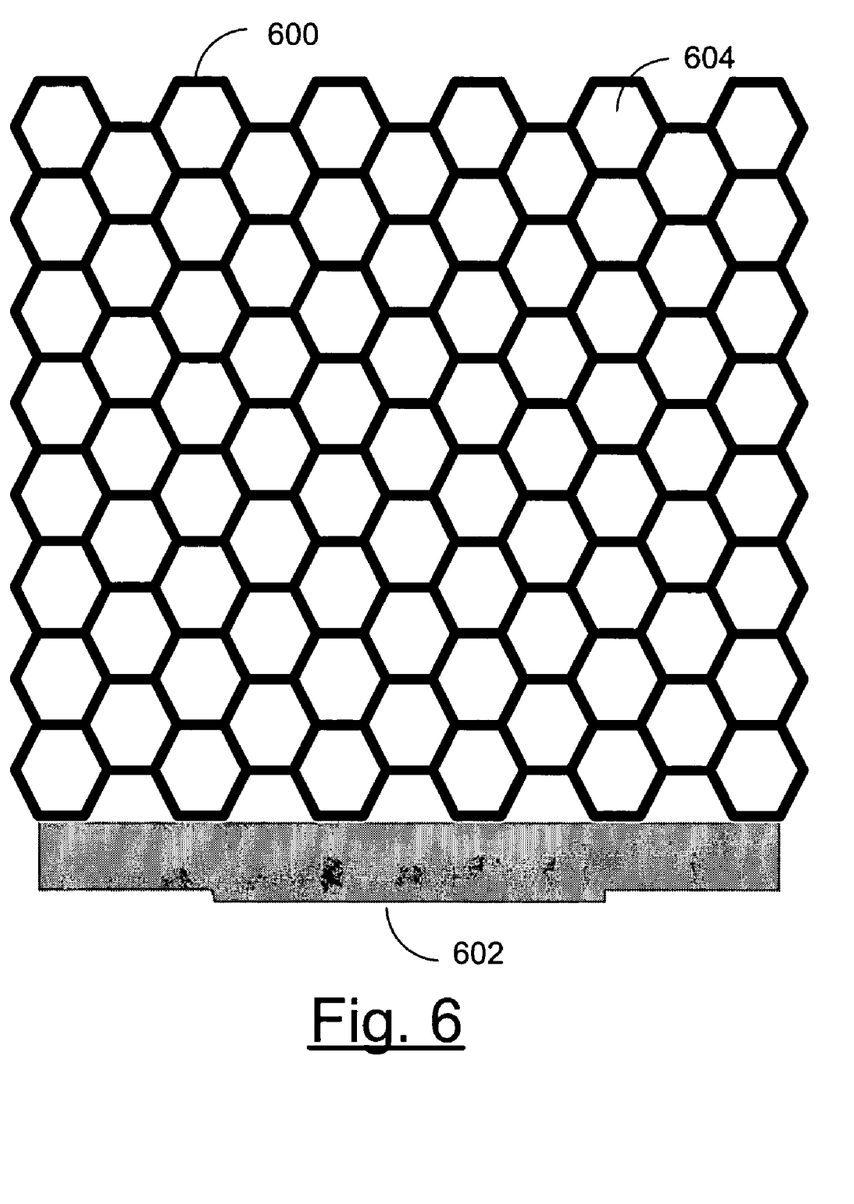
FIG. 6 is a side view of a high surface area heat sink manufactured by the process illustrated in FIGS. 5A to 5C according to the present invention.

FIG. 6 is a side view of a high surface area heat sink manufactured by the process illustrated in FIGS. 5A to 5C according to the present invention. In this example embodiment of the present invention, a plurality of stamped sheets of thermally conductive material has been assembled into a high surface area heat sink. Those of skill in the art will recognize that the sheets of stamped material 506 may be mechanically and thermally coupled using a variety of methods such as soldering or welding. This finished heat sink includes a heat sink body 600, a heat sink base 602 configured to thermally couple with a heat generating electronic device and includes an array of cylindrical openings 604 in the heat sink 600 resulting in a high surface area heat sink.

Figure 7:
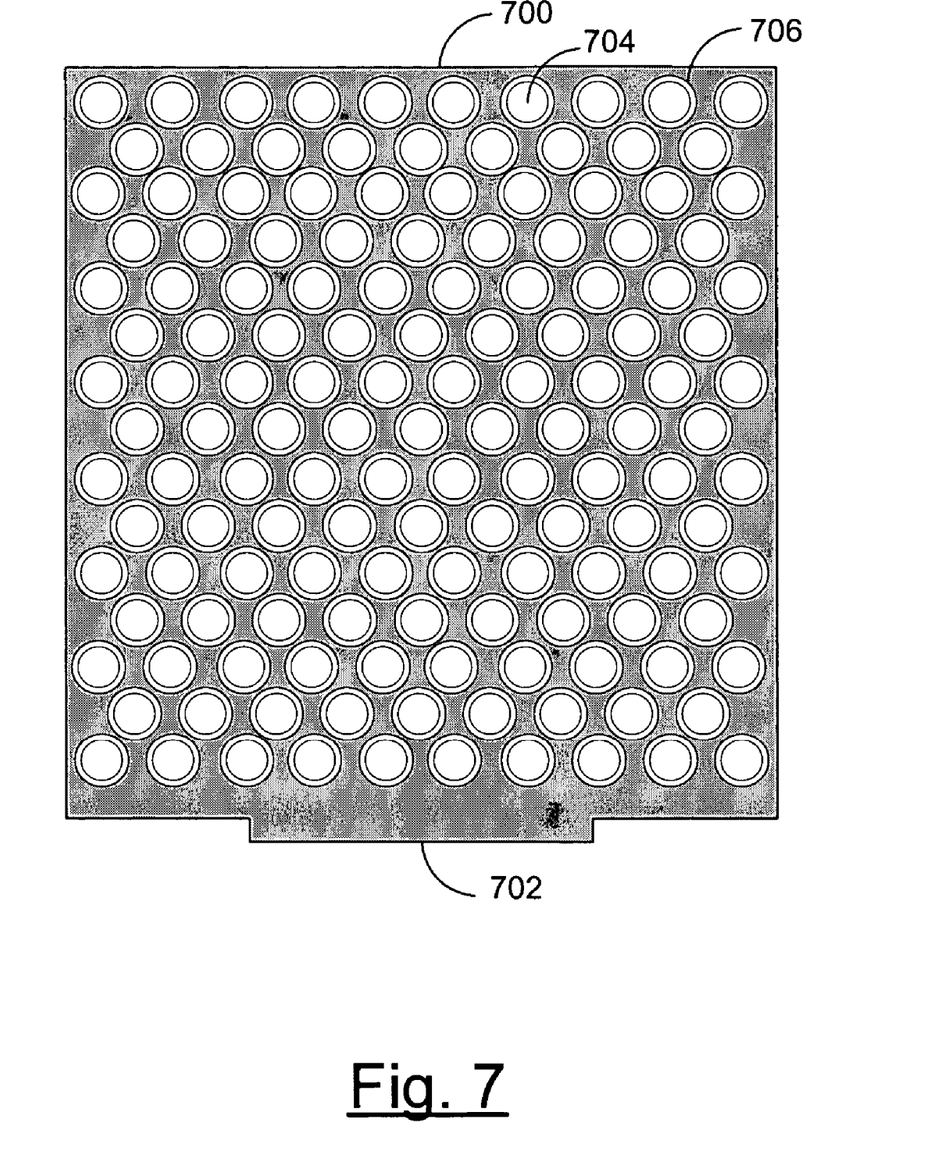
FIG. 7 is a side view of a high surface area heat sink according to the present invention.

FIG. 7 is a side view of a high surface area heat sink according to the present invention. This example embodiment of the present invention is a heat sink including a heat sink body 700, a heat sink base 702 configured to thermally couple with a heat generating electronic device and includes an array of cylindrical openings 704 lo resulting in a high surface area heat sink. Also, each of the cylindrical openings 704 includes a slight chamfer 706 on one or both ends of the cylinders. This chamfer helps to funnel the air into the cylindrical openings 704 and reduces turbulence in the air flow at the leading face of the heat sink body 700. This example embodiment is a simple example of the present invention such as may be used as a prototype constructed by milling a block of thermally conductive material such as aluminum or copper. While this example embodiment of the present invention does have a high surface area, it contains more material than other examples and thus may weigh more, and also be more expensive. However, its construction is quite simple compared to the other example embodiments shown previously, and may be used in situations where ease of construction is critical.

Figure 8:
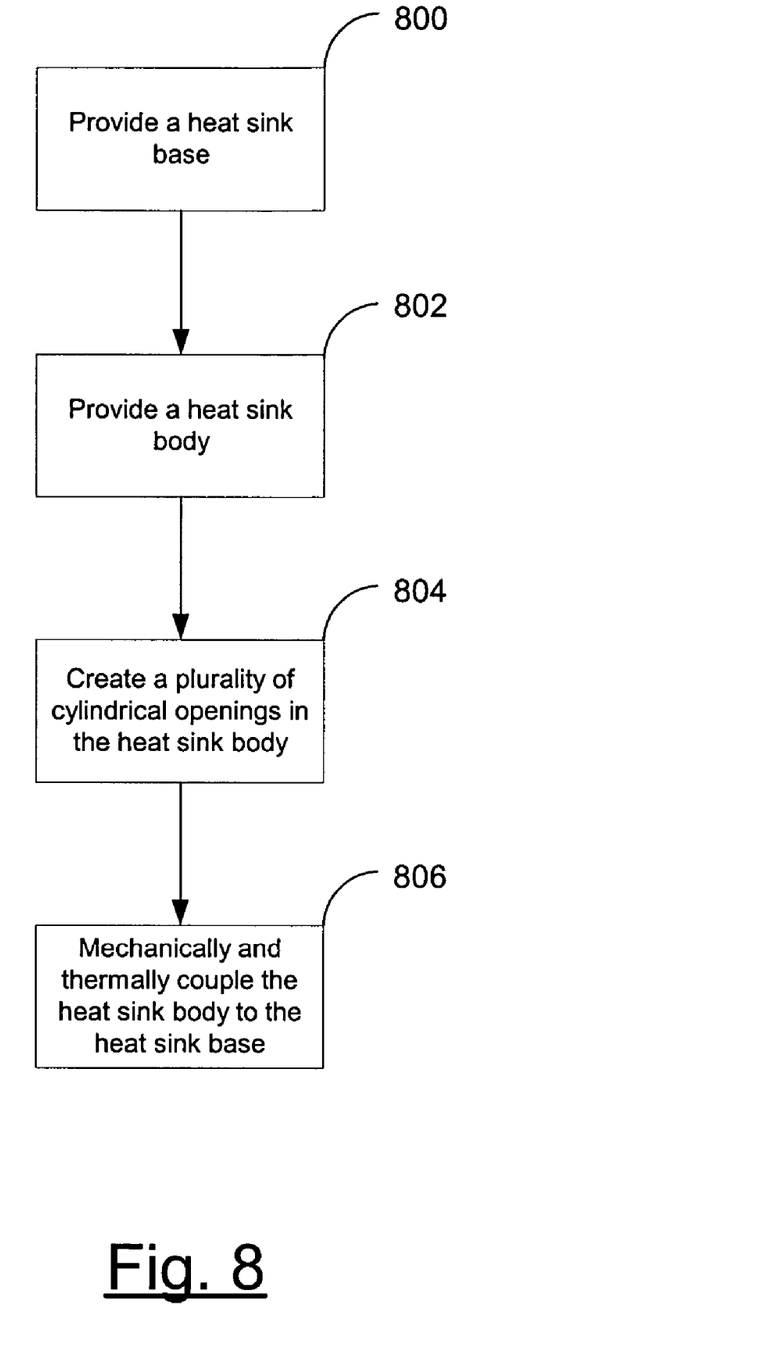
FIG. 8 is a flow chart of a method of constructing a high surface area heat sink according to the present invention.

FIG. 8 is a flow chart of a method of constructing a high surface area heat sink according to the present invention. In a step 800, a heat sink base is provided. In a step 802, a heat sink body is provided. In a step 804, a plurality of cylindrical openings is created in the heat sink body. In a step 806, the heat sink body is thermally and mechanically coupled to the heat sink base.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A beat sink comprising:
    a heat sink base; and
    a heat sink body mechanically and thermally coupled with said heat sink base,
        wherein said heat sink body includes a plurality of cylindrical openings; and
        wherein said cylindrical openings include chamfers in at least one face of said heat sink body.
2. A heat sink as recited in claim 1,
    wherein plurality of cylindrical openings forms an array.
3. A heat sink as recited in claim 1,
    wherein said plurality of cylindrical openings have a square cross-section.
4. A heat sink as recited in claim 1,
    wherein said plurality of cylindrical openings have a rectangular cross-section.
5. A heat sink as recited in claim 1,
    wherein said plurality of cylindrical openings have a circular cross-section.
6. A heat sink as recited in claim 1,
    wherein said plurality of cylindrical openings have a hexagonal cross-section.
7. A heat sink as recited in claim 1,
    wherein said heat sink body is aluminum.
8. A beat sink as recited in claim 1,
    wherein said heat sink body is copper.
9. A heat sink as recited in claim 1,
    wherein said heat sink base is configured to thermally couple with a heat generating electronic device.
10. A method for constructing a heat sink comprising the steps of:
    a) providing a heat sink base;
    b) providing a heat sink body;
    c) creating a plurality of cylindrical openings in said heat sink body, wherein said cylindrical openings include chamfers in at least one face of said heat sink body; and
    d) mechanically and thermally coupling said heat sink body to said heat sink base.
11. A method for constructing a heat sink as recited in claim 10,
    wherein plurality of cylindrical openings forms an array.
12. A method for constructing a beat sink as recited in claim 10,
    wherein said plurality of cylindrical openings have a square cross-section.

13. A method for constructing a heat sink as recited in claim 10,
    wherein said plurality of cylindrical openings have a rectangular cross-section.

14. A method for constructing a heat sink as recited in claim 10,
    wherein said plurality of cylindrical openings have a circular cross-section.

15. A method for constructing a heat sink as recited in claim 10,
    wherein said plurality of cylindrical openings have a hexagonal cross-section.

16. A method for constructing a heat sink as recited in claim 10,
    wherein said heat sink body is aluminum.

17. A method for constructing a heat sink as recited in claim 10,
    wherein said heat sink body is copper.

18. A method for constructing a heat sink as recited in claim 10,
    wherein said heat sink base is configured to thermally couple with a heat generating electronic device.

* * * * *

UNITED STATES PATENT AND TRADEMARK OFFICE
CERTIFICATE OF CORRECTION

PATENT NO. : 7,028,754 B2
APPLICATION NO. : 10/832963
DATED : April 18, 2006
INVENTOR(S) : Brent A. Boudreaux It is certified that error appears in the above-identified patent and that said Letters Patent is hereby corrected as shown below:

In column 3, line 50, after "704" delete "lo".

In column 4, line 21, in Claim 1, delete "beat" and insert -- heat --, therefor.

In column 4, line 46, in Claim 8, delete "beat" and insert -- heat --, therefor.

In column 4, line 64, in Claim 12, delete "beat" and insert -- heat --, therefor.

Signed and Sealed this

Nineteenth Day of May, 2009

JOHN DOLL
*Acting Director of the United States Patent and Trademark Office*